United States Patent [19]

Takezawa et al.

[11] Patent Number: 4,695,858
[45] Date of Patent: Sep. 22, 1987

[54] DUPLEX OPTICAL COMMUNICATION MODULE UNIT

[75] Inventors: Hatsuo Takezawa, Yokohama; Kenichi Donuma, Koshigaya; Shuhei Katagiri, Tokyo; Shigeyuki Sakura, Yokohama, all of Japan

[73] Assignee: Tokyo Shibaura Denki Kabushiki Kaisha, Kawasaki, Japan

[21] Appl. No.: 514,250

[22] Filed: Jul. 15, 1983

[30] Foreign Application Priority Data

Jul. 19, 1982 [JP] Japan .................. 57-124424
Jun. 20, 1983 [JP] Japan .................. 58-109345

[51] Int. Cl.⁴ .......................................... H01L 31/12
[52] U.S. Cl. .................................... 357/19; 357/17; 357/74; 357/30
[58] Field of Search .................. 357/19, 74, 17, 30

[56] References Cited

FOREIGN PATENT DOCUMENTS 0004800 10/1979 European Pat. Off. .
2601956 7/1976 Fed. Rep. of Germany .
2319980 2/1977 France .
57-93587 6/1982 Japan .
58-101474 6/1983 Japan ..................... 357/19

Primary Examiner—Andrew J. James
Assistant Examiner—Mark Prenty
Attorney, Agent, or Firm—Cushman, Darby & Cushman

[57] ABSTRACT

A duplex optical communication module unit is disclosed, which comprises a ceramic substrate and first and second metal shells having respective transparent window members and hermetically bonded to the ceramic substrate so as to define a first and second space, respectively. A light-emitting element is assembled in the first space, and a light-emitting element and a circuit element for amplifying the photocurrent from the light-emitting element are assembled in the second space. Metallization layers are formed on the ceramic substrate over a substantial area thereof, light-receiving and light-transmitting sections being shielded by the metallization layers and metal shells.

19 Claims, 14 Drawing Figures

DUPLEX OPTICAL COMMUNICATION MODULE UNIT

BACKGROUND OF THE INVENTION

This invention relates to duplex optical communication module units and duplex optical communication module devices using these module units.

The optical communication systems include simplex or unilateral communication systems and duplex or bilateral communication systems. In the simplex or unilateral optical communication system, a transmitting station has a light-emitting element such as LED (light-emitting diode) or LD (laser diode) for converting an electric signal to an optical signal, while a receiving station has PD (photodiode) or an APD avalanche photodiode) for converting the optical signal into electric signal. The two stations are coupled together by an optical fiber, and communication is done unilaterally from the transmitting station to the receiving station. In the duplex or bilateral optical communication system in which each of two communicating stations transmit and receive signal to and from the other, a light-emitting element and a light-receiving element are provided in each station. The light-emitting element and the light-receiving element in one station are respectively coupled to the light-receiving elements and the light-emitting element in the other station via respective optical fibers.

The light-emitting and light-receiving elements are assembled respectively in transmitting and receiving module units. The transmitting and receiving module units are assembled in an optical communication module device.

Figures 1, 2, 3:
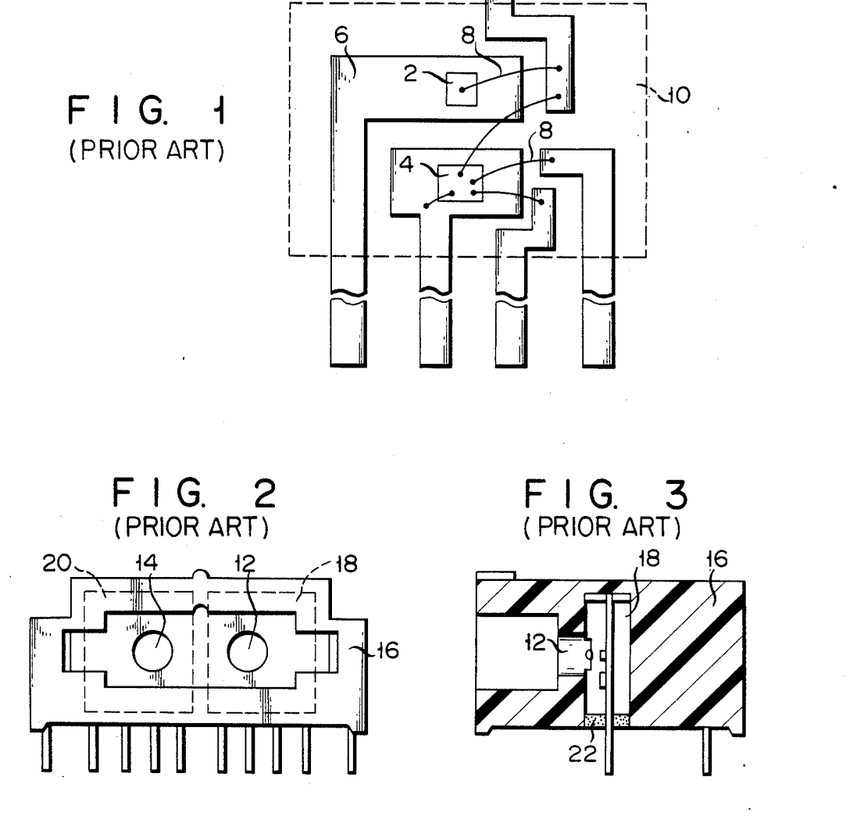
FIG. 1 is a schematic view showing a prior art transmitting module unit for optical communication.
FIGS. 2 and 3 are respectively a front view and an axial sectional view showing a prior art bilateral optical communication module device.

FIG. 1 shows a prior art transmitting module unit. It has a light-emitting element 2 and an IC chip 4 as a circuit for driving the element 2. The light-emitting element 2 and IC chip 4 are secured to a lead frame 6, connected together by wire leads 8 and molded in a transparent plastic material 10. Although not shown, a prior art receiving module unit has a similar structure, which has a light-receiving element and an IC chip as a receiver circuit for amplifying and reproducing the output signal of the light-receiving element. The light-receiving element and IC chip are secured to a lead frame, connected together by wire leads and molded in a transparent plastic material. The transmitting and receiving module units are assembled in a bilateral module device, for instance, as shown in FIGS. 2 and 3. The device comprises an opaque or light-impermeable plastic molding 16 having recesses 12 and 14 for receiving optical connectors for signal reception and transmission and receiving and transmitting module units 18 and 20 received in predetermined recesses of the molding 16 and secured to the recesses by an adhesive 22. Since the transmitting section or transmitting module unit and the receiving section or receiving module unit are packed in a single plastic molding 16, the bilateral module device can be readily handled in operation. In addition, when a plug having two juxtaposed optical fibers is used, the plug may be readily coupled to the bilateral module device.

However, the bilateral module device has the following drawbacks.

(1) The receiving module unit deals with very small signal of the order of several hundred nA and is susceptible to the influence of external noise. On the other hand, in the transmitting module unit provided adjacent to the receiving module unit, the light-emitting element will carry as large current as several ten mA. Noise, therefore, is generated with the switching of this large current, and is coupled to the adjacent receiving module unit to cause erroneous operation thereof.

(2) The transmitting and receiving module units have low reliabilities, especially moisture resistance characteristics, because the module units are molded in a transparent plastic material. A pressure cooker test under conditions of 121° C. and 2 atom. showed that a trouble occurred in the module in several hours.

(3) The light-emitting and light-receiving elements must be efficiently optically coupled to the optical fiber in order to avoid or reduce attenuation of light. This requires precise alignment of the optical axis of each element with that of the optical fiber axis. However, a slight warping or deformation of the lead frame on which each element is mounted would cause a shift of the position of the optical axis of each element, leading to a deviation from the alignment of the optical axes. The deviation from the alignment of the two optical axes may also be caused from the dimensional difference between the module units and a plug having two juxtaposed optical fibers because the module units are independently fixed in the light-impermeable plastic molding 16.

SUMMARY OF THE INVENTION

The invention is directed to solving the problems discussed above, and its object is to provide a duplex or bilateral optical communication module unit and a duplex or bilateral optical communication module device which is free from erroneous operation particularly due to noise.

The invention provides a duplex optical communication module unit comprising:

a first ceramic substrate having a first and second major surfaces, first conductor layers being formed on the first major surface;

a first shell made of metal, having a first transparent window member, hermetically bonded to the first major surface of the first cetamic substrate and defining a first space with the first major surface of the first ceramic substrate;

a second shell made of metal, having a second transparent window member, heremetically bonded to the first major surface of the first ceramic substrate and defining a second space with the first major surface of the first ceramic substrate;

a first metallization layer formed on the first major surface of the first ceramic substrate substantially over the entire area in the first space except for an insulating areas surrounding the first lead layers;

a light-receiving element formed on the first manor surface of the first ceramic substrate in the first space in opposition to the first transparent window member;

a circuit element formed on the first major surface of the first ceramic substrate in the first space, for amplifying the output current of the light-receiving element, the circuit element having an AC-grounded terminal;

a light-emitting element formed on the first major surface of the first ceramic substrate in the second space in opposition to the second transparent window member; and a lead terminal connected to the AC-grounded terminal of the circuit element.

The invention also provides a duplex optical module device comprising:

a bilateral optical module unit including a substrate lamination of a plurality of ceramic substrates having predetermined conductive layers (24, 26, 28), a receiving module chamber and a transmitting module chamber, the module chambers being formed on the substrate lamination optically insulated from each other and hermetically sealded, a light-receiving element provided in the receiving module chamber, a light-emitting element provided in the transmitting module chamber, and first and second shells having respective transparent members facing the light-receiving and light-emitting elements, respectively; and an opaque receptacle for securing the duplex optical module unit and having receiving sections for receiving optical connectors inserted in opposition to the light-receiving and light-emitting elements.

DETAILED DESCRIPTION OF THE PREFERRED EMBODIMENTS

Preferred embodiments of the invention will now be described.

Figure 4:
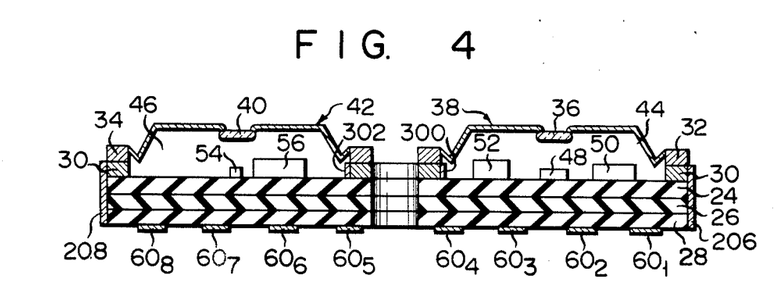
FIG. 4 is a sectional view showing a bilateral optical communication module unit according to the invention.

FIG. 4 is a schematic sectional view of an embodiment of the duplex or bilateral optical communication module unit according to the invention. The module unit comprises a lamination of first to third ceramic substrates 24, 26 and 28, a ceramic spacer 30 laminated on the first ceramic substrate 24 and metal shells 38 and 42 hermetically sealed to the spacer 30 via respective KOV weld rings 32 and 34 and having respective transparent or light-permeable window members 36 and 40. Though not shown in FIG. 4, predetermined lead layers and metallization layers are formed on the major surfaces of the ceramic substrates 24, 26 and 28. The light-permeable window members 36 and 40 may be glass discs or convex lenses. The first ceramic substrate 24, spacer 30, weld ring 32 and shell 38 define a first space 44. Likewise, the first ceramic substrate 24, spacer 30, weld ring 34 and shell 42 define a second space 46.

The first and second spaces 44 and 46 are optically separated from each other by the spacer 30, weld rings 32 and 34 and shells 38 and 42.

A light-receiving element 48 e.g. a PD is provided on the first ceramic substrate 24 in the first space 44 in opposition to the light-permeable window member 36. A circuit element 50 e.g. a receiver IC for amplifying the output photocurrent from the light-receiving element 48 a capacitor 52 and other necessary circuit elements are also provided on the first ceramic substrate 24 in the first space 44. A light-emitting element 54 e.g. an LED is provided on the first ceramic substrate 24 in the second space 46 in opposition to the light-permeable window member 40. A circuit element 56 for driving the light-emitting element 54 e.g. a driver IC is also provided on the first ceramic substrate 24 in the second space 46. The third ceramic substrate 28 has lead terminals $60_1$ to $60_8$ provided on its back surface, i.e., its surface opposite the surface in contact with the second ceramic substrate 26. The lead terminals $60_1$ to $60_8$ are provided for such purposes as supplying current to the light-receiving element and circuit element for amplifying and reproducing the output photocurrent from the light-receiving element, taking out the reproduced signal, supplying current to the light-emitting element and circuit element for driving the light-emitting element and supplying a drive signal to the light-emitting element.

The structures of the individual laminated ceramic substrates and spacer will now be described in detail. FIGS. 5 to 8 are tops views of the spacer 30 and first to third ceramic substrates 24, 26 and 28 respectively, and FIG. 9 is a back view of the third ceramic substrate 28. In FIGS. 5 to 9, hatched areas represent metallization layers.

Figure 6:
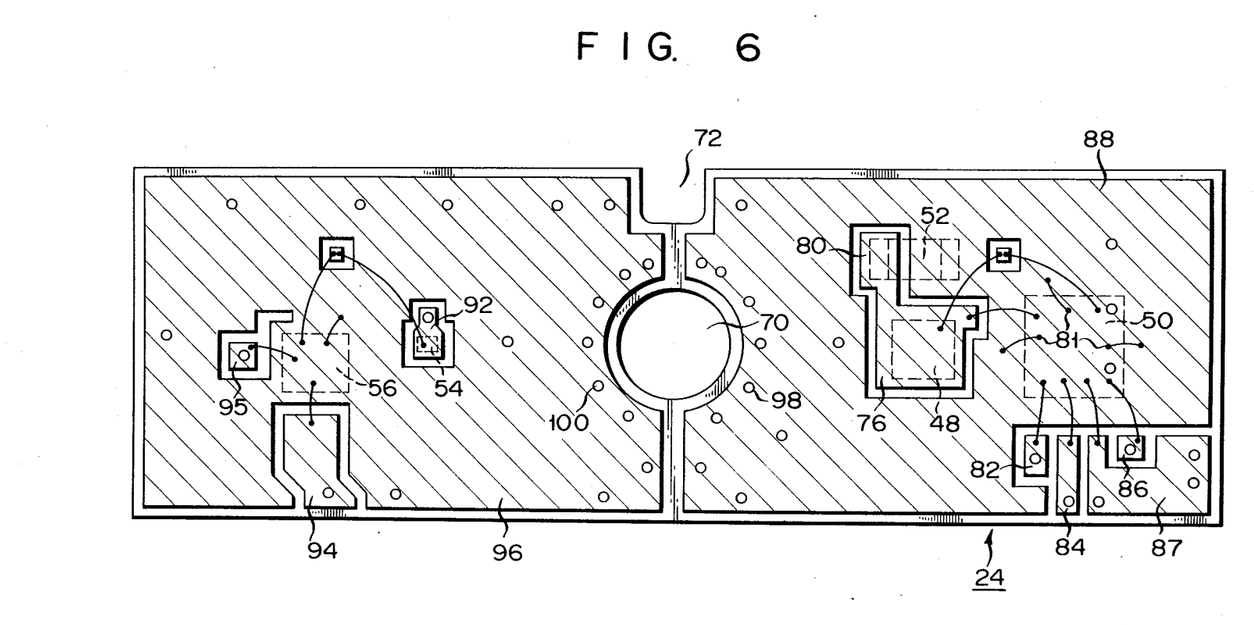
FIGS. 6 through 8 are top views respectively showing first to third ceramic substrates in the module unit of FIG. 4, respectively.

As shown in FIG. 6, the first ceramic substrate 24 has a central circular opening 70 and also has a rectangular notch 72 formed in a central portion of one longitudinal edge thereof. On the major surface of the right half part of the first ceramic substrate 24 which is defined by a line connecting of the central circular opening 70 and notch 72 are formed conductor layer 76 on which the light-receiving element 48 is provided, a conductive layer 80 on which a bypass capacitor 52 is provided, conductive layers 82 and 84 for conducting a power and a conductive layer 86 for taking out an output from the amplifying circuit 50. Further, a metallization layer 88 is formed on the major surface of the right half part over substantially the entire area thereof except for insulating areas surrounding the lead layers and an insulating area constituting a boundary zone between the right half part and the left half part. The amplifying circuit 50 has AC-grounded terminals 81. The terminals are connected to the metallization layer 88 by bonded lead wires and are also connected to the lead terminal $60_4$ to be described layer in detail. The AC-grounded terminals of the amplifying circuit mean either power supply terminals or grounded terminals. In this embodiment, the AC-grounded terminals are grounded terminals connected to the metallization layer.

On the major surface of the left half part of the first ceramic substrate 24 are formed a conductor layer 92 on which the light-emitting element 54 is provided, a conductor layer 94 for conducting a power to the driving circuit 56 and a conductor layer 95 for conducting an input signal to the driving circuit 56. A metallization layer 96 is further formed on the major surface of the left half part of the substrate 24 over substantially the entire area thereof except for insulating areas surrounding the lead layers and an insulating area constituting the boundary zone between the left half part and the right half part. The right half part and the left half part of the first ceramic substrate 24 are further provided with a plurality of through-holes 98 and 100. The through-holes 98 and 100 surrounds the opening 70. These through-holes 98 and 100 are filled with conductive material. The conductive material filled in the through-holes holes 98 contacts the metallization layer 88. The conductive material filled in the through-holes 100 contacts the metallization layer 96.

Figure 7:
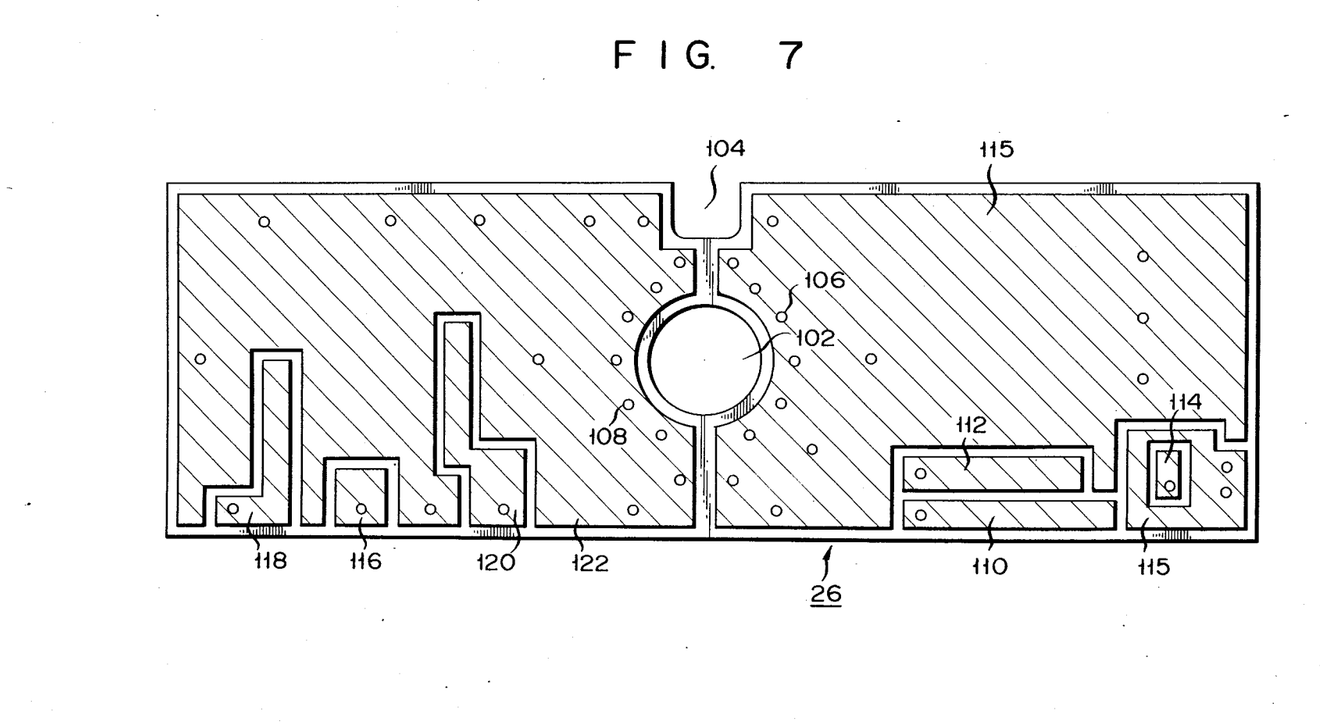

The second ceramic substrate 26, as shown in FIG. 7, has a central circular opening 102 corresponding to the central circular opening 70, a rectangular notch 104, corresponding to the rectangular notch 72, formed in a central portion of one longitudinal edge and a plurality of through-holes 106 and 108 corresponding to the through-holes 98 and 100, respectively, and surrounding the opening 102. On the major surface of the right half part of the second ceramic substrate 26 which is defined by a line connecting the central circular opening 102 and the notch 104 are formed conductor layers 110 and 112 for conducting a power and a conductor layer 114 for taking out the output signal. On the major surface of the right half part is further formed a metallization layer 115 over substantially the entire area except for insulating areas surrounding the conductor layers and an insulating boundary zone between the right half part and the left half part. On the major surface of the left half part are formed conductor layers 116, 118 and 120 for conducting the input signal, conducting a power to the driver circuit IC chip and conducting a power to the light-emitting element, respectively. On the major surface of the left half part of the substrate 26 is further formed a metallization layer 122 over substantially the entire area except for insulating areas surrounding the conductor layers and an insulating bondary zone between the left half part and right half part. The conductor layers 110, 112, 114, 113, 116, 118 and 120 provided on the substrate 26 are connected to the respective conductor patterns 84, 82, 86, 87, 94, 95 and 92 provided on the substrate 24 through the conductive material filled in the associated through-holes formed in the substrate 24. The metallization layers 115 and 122 on the second substrate 26 are respectively connected to the metallization layers 88 and 96 on the first substrate 24 through the conductive material filled in the respective through-holes 98 and 100 formed in the first substrate 24. The amplifying IC 50 and driving IC 56 are connected to the conductor patterns 114 and 120 on the second ceramic substrate 26, respectively.

Figure 8:
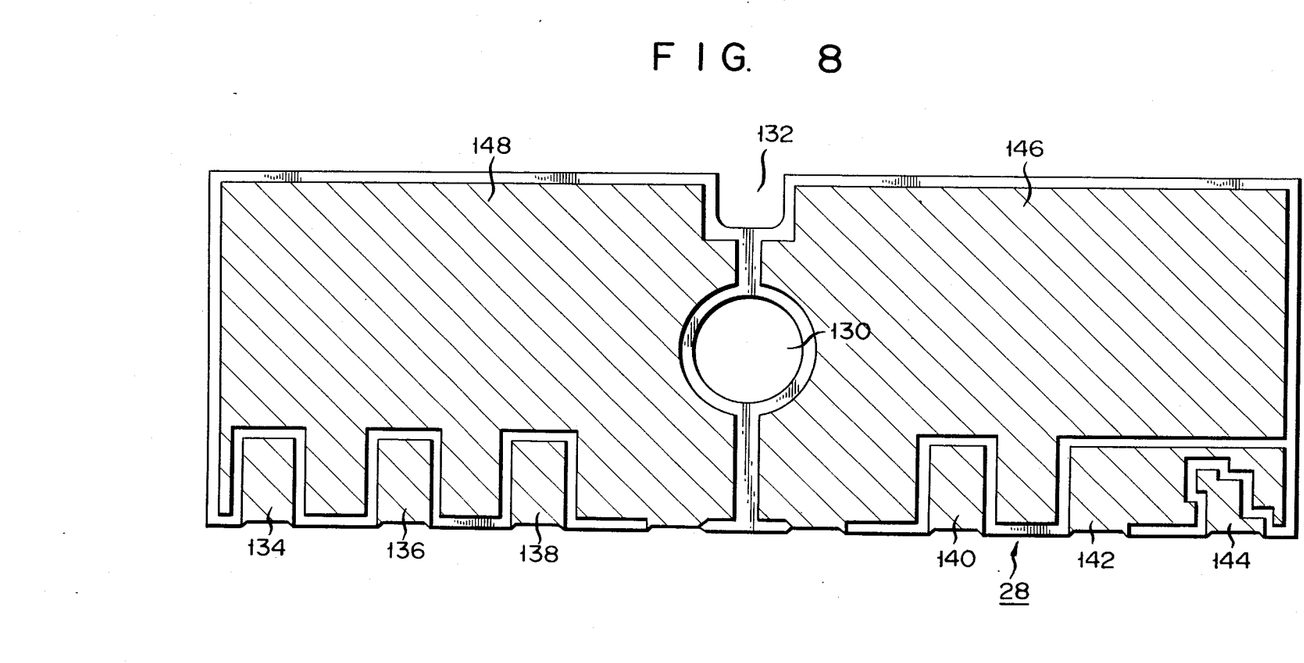
Figure 9:
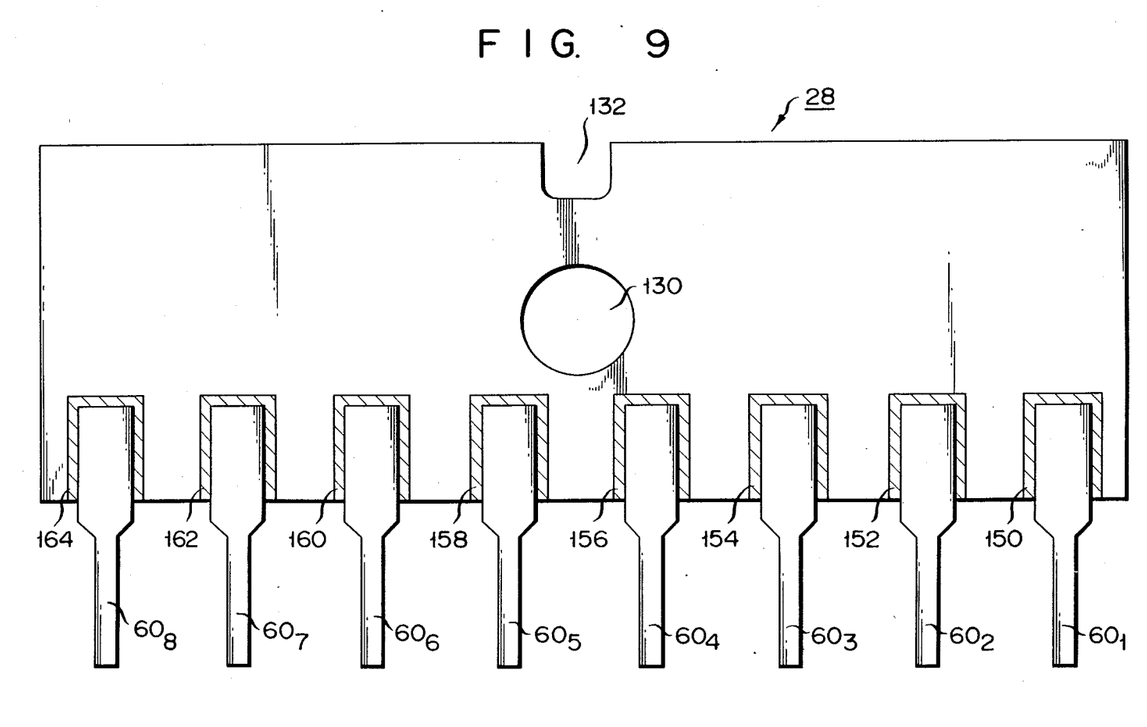
FIG. 9 is a back view showing the third ceramic substrate shown in FIG. 8.

The third ceramic substrate 28, the top view of which is shown in FIG. 8, has a central circular opening 130 corresponding to the central circular opening 70 and a rectangular notch 132 corresponding to the rectangular notch 72 formed in a central portion of one longitudinal edge. On the major surface are formed predetermined conductor layers 134, 136, 138, 140, 142 and 144 which are connected to the respective conductor layers 118, 116, 120, 110, 112 and 114 on the second ceramic substrate 26 through the conductive material filled in the associated through-holes formed in the second substrate 26. Metallization layers 146 and 148 are formed on the major surfaces of the right half part and the left half part defined by the central opening 130 and the notch 132 over substantially the respective entire areas thereof except for insulating areas surrounding the conductor layers and an insulating boundary zone between the right half part and the left half part. The metallization layers 146 and 148 on the third substrate 28 are connected to the respective metallization layers 115 and 122 formed on the substrate 26 via the conductive material filled in the respective through-holes 106 and 108 formed in the second substrate 26. The conductor layers 134, 136 and 138, metallization layers 148 and 146 and conductor layers 140, 142 and 144 are connected to respective conductor layers 150, 152, 154, 156, 158, 160, 162 and 164 formed on the back surface of the third substrate 28, as shown in FIG. 9, via a conductive film formed on an edge surface of the third substrate 28. Lead terminals $60_1$ to $60_8$ are attached to the conductor patterns 150, 152, 154, 156, 158, 160, 162 and 164. The lead terminal $60_1$ constitutes an input signal terminal at a transmitting section, $60_2$ a power supply terminal at a transmitting section, $60_3$ a power supply terminal for a light-emitting element, $60_4$ a ground terminal, $60_5$ and $60_6$ power supply terminals at a receiving section, $60_7$ a ground terminal, and $60_8$ an output terminal at a receiving section.

Figure 5:
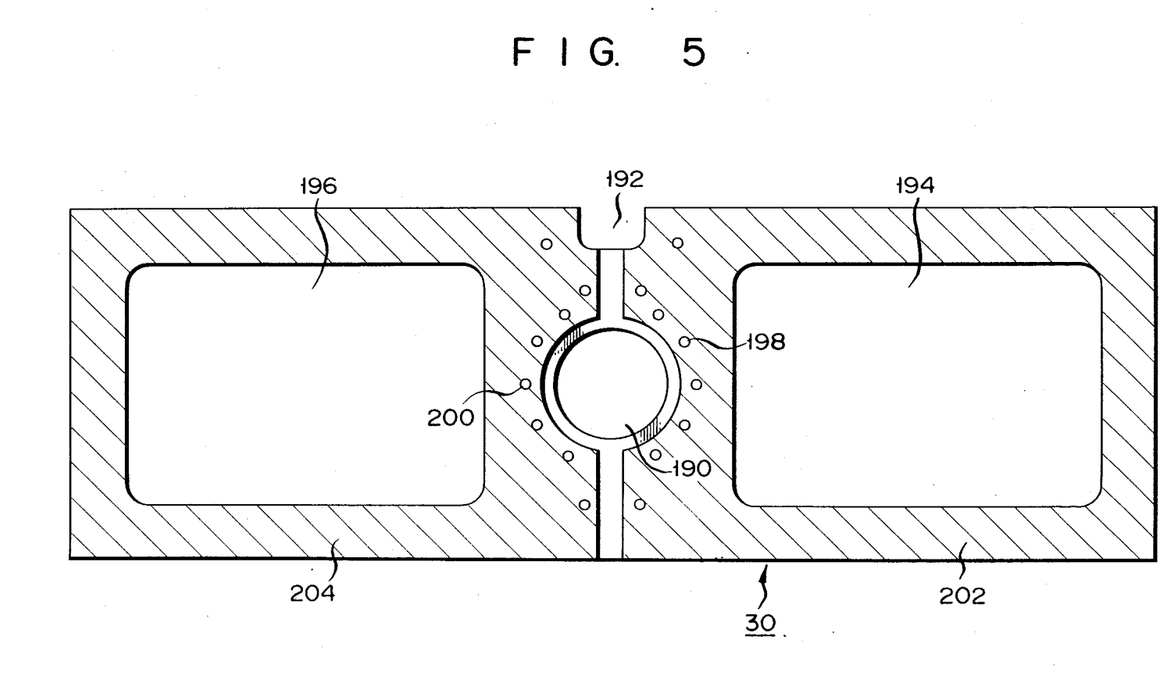
FIG. 5 is a top view showing a spacer in the module unit shown in FIG. 4.

The spacer 30, as shown in FIG. 5, has a central circular opening 190 corresponding to the central circular openings 70 and a rectangular notch 192, corresponding to the rectangular notch 72, formed in a central portion of one longitudinal edge, as in the first to third ceramic substrates 24, 26 and 28 described above. The spacer 30 further has rectangular openings 194 and 196, respectively, at the right half part and and left half part. The openings 194 and 196 correspond to the first and second spaces 44 and 46, respectively. On the major surfaces of the right half part and the left hand part defined by the central opening 190 and the notch 192 are formed metallization layers 202 and 204, respectively, except for an insulation boundary zone between the right half part and the left half part. The spacer 30 further has through-holes 198 formed in the right half part along the opening 190 and through-holes 200 formed in the left half part along the opening 190. The metallization layers 202 and 204 are connected to the respective metallization layers 88 and 96 formed on the first ceramic substrate 24 via conductive material filled in the through-holes 198 and 200. Conductor layers 300 and 302, as shown in FIG. 4, are formed on the inner edge surfaces of the openings 194 and 196, and are connected to the metallization layers 202 and 204, respectively. Therefore, the shell 38 and the metallization layer 88, for example, are connected to the lead terminal $60_5$. The first to third ceramic substrates 24, 26 and 28 and spacer 30 are made of ceramic sheet and are laminated in the order as described. The resultant lamination is thermally treated. The predetermined conductor layers and metallization layers formed on the substrates are connected to one another by the conductive material filled in the through-holes formed in the respective predetermined positions. Metallization layers 206 and 208, as shown in FIG. 4, are formed on the opposite outer edge surfaces of the ceramic substrate lamination. Further, although not shown, a metallization layer is formed on the longitudinal edge surface with the notch of the laminated substrates. The metallization layer is separated by the notch of the laminated substrates into first and second metallization layer parts electrically insulated from each other and corresponding to the respective first and second spaces. The first metal shell 38 is electrically connected to the metallization layer 202 on the spacer 30 via the weld ring 32. The second metal shell 42 is electrically connected to the metallization layer 204 on the spacer 30 via the weld ring 34. The first and second spaces 44 and 46 are, therefore, surrounded by the metallization layers formed on the spacer and ceramic substrates, through-holes formed in the spacer and ceramic substrates around the central openings thereof, conductive layers formed on the edge surfaces of the spacer and ceramic substrates and first and second metal shells, and shield from the outside.

With the construction described above, the first space which accommodates the light-receiving element and amplifying circuit is shielded from the outside. Thus, although the receiving section which deals with very small photocurrents is provided adjacent to the transmitting section in which a comparatively large current is switched at a high speed so that noize is generated, erroneous operation of the receiving section will never be caused by the noise generated in the transmitting section. Particularly, in the above embodiment not only the receiving section but also the transmitting section is shielded, so that the possiblity of erroneous operation of the receiving section due to noise generatd in the transmitting section can be reliably eliminated.

Further, since the light-emitting and light-receiving elements are formed on the same substrate in a fixed positional relation to each other, the assembly of the module unit in the receptacle can be done without need of determining the distance between the two elements.

Further, the envelope of the module unit has a hermetically sealed structure constituted by ceramic members, metal members and glass members, so the high temperature resistance characteristic, low temperature resistance characteristic and moisture resistance characteristic are greatly improved over the prior art module unit consisting of a plastic molding. The module units according to the invention could withstand a pressure cooker test for 50 hours without occurrence of any falut.

Further, since the transmitting and receiving module units in the above embodiment are provided on a single ceramic substrate lamination, the size of the module unit can be reduced compared to a prior art module unit in which the transmitting and receiving module units are provided separately.

Figure 10:
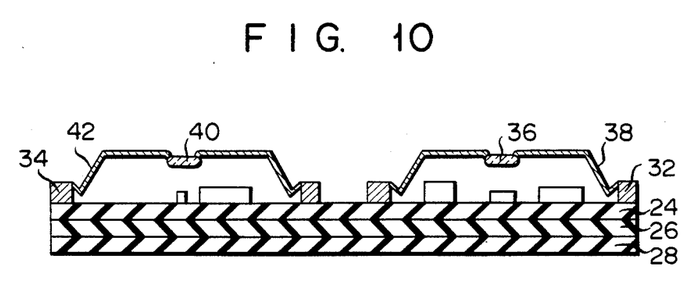
FIGS. 10 through 12 are sectional views showing respective modifications of the module unit shown in FIG. 4.
Figure 11:
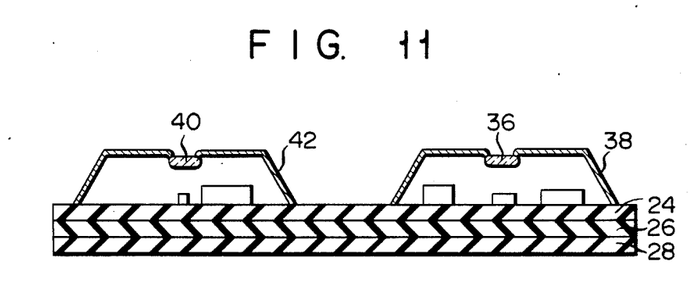
Figure 12:
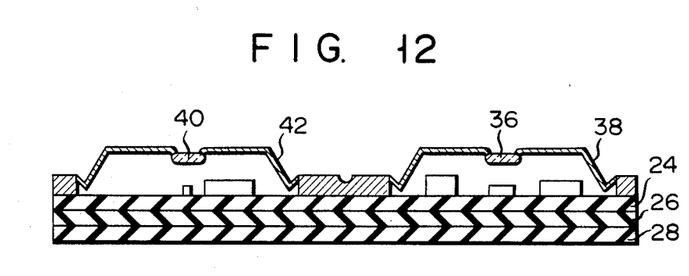

FIGS. 10 through 12 show modifications of the module unit of FIG. 4, respectively. In FIGS. 10 through 12, the identical parts as those in FIG. 4 are designated by like reference numerals.

The example of FIG. 10 does not use spacer 30 in the preceding embodiment of FIG. 4. More specifically, weld rings 32 and 34 are soldered directly to the first major surface of first ceramic substrate 24, and shells 38 and 40 are welded to the weld rings.

The example of FIG. 11 does not use weld rings as well. That is, shells 38 and 42 are soldered directly to the metallization layers on the first major surface of first ceramic substrate 24.

In the example of FIG. 12, unlike the previous embodiment, shells 38 and 42 are integral with each other.

In the previous embodiment of FIG. 4, the circuit element for driving the light-emitting element has been assembled in the transmitting section. Alternatively, the driver circuit may be provided externally, with the sole light-emitting element provided in the transmitting section. Further, the light-receiving element and amplifier circuit in the receiving section may be integrated together. Further, the plurality of throughholes surrounding the central circular opening of the spacer and the substrates may be replaced with slots having an arc or like shape surrounding the central circular opening to obtain the same effects.

Figure 13:
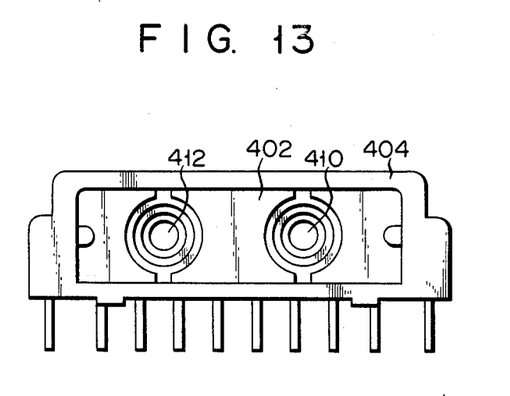
FIGS. 13 and 14 are respectively a front view and an axial sectional view showing a module device incorporating the module unit shown in FIG. 4.
Figure 14:
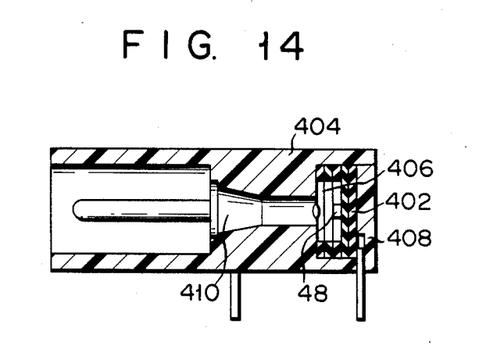

FIGS. 13 and 14 show a different embodiment of the invention constituting a bilateral optical communication module device incorporating the bilateral optical communication module unit shown in FIG. 4. More specifically, the device comprises a module unit 402 and a receptacle 404 consisting of a light-impermeable plastic molding accommodating the module unit 402. The module unit 402 is received in a recess formed in the molding 404 and secured thereto by a cap 408. The molding 404 has further recesses 410 and 412 respectively opposing light receiving and light-emitting elements 48 and 54 (light-emitting element 54 being not shown) of the module unit 402. Optical juxtaposed connectors of receiving and transmitting optical fibers are inserted into theses recesses 410 and 412 for optical communication.

With the construction as described, using the single module unit 402 having the light-emitting and light-receiving elements 48 and 54 formed on the same substrate, unlike the prior art module unit where the transmitting and receiving modules are provided separately, there is no need of positioning the two modules relative to each other when the module unit is set in the receptacle. Further, since the light-receiving and light-emitting elements 48 and 54 are secured to the substrate at a fixed distance from each other, they can be optically coupled with high precision to the juxtaposed connectors to minimize the attenuation of light.

As has been described in the foregoing, according to the invention it is possible to obtain highly reliable bilateral optical communication module unit and bilateral optical communication module device, in which the receiving section which deals with very weak electric signals is shielded from the transmitting section and is thus free from erroneous operation due to external noise.

What is claimed is:

1. A duplex optical communication module unit comprising:
    a first ceramic substrate having first and second major surfaces, first conductor layers being formed on said first major surface;
    a first shell of metal, having a first transparent window member, heremetically sealed to said first major surface of said first ceramic substrate and defining a first space with said first major surface of said first ceramic substrate;
    a second shell of metal, having a second transparent window member, heremetically sealed to said first major surface of said first ceramic substrate and defining a second space with said first major surface of said first ceramic substrate;
    a first metallization layer formed on said first major surface of said first ceramic substrate substantially over the entire area in said first space except for insulating areas surrounding said first conductor layers;
    a light-receiving element formed on said first major surface of said first ceramic substrate in said first space in opposition to said first transparent window member;
    a circuit element formed on said first major surface of said first ceramic substrate in said first space, for amplifying the output current of said light-receiving element, said circuit element having an AC-grounded terminal;
    a light-emitting element formed on said first major surface of said first ceramic substrate in said second space in opposition to said second transparent window member; and a lead terminal connected to said AC-grounded terminal of said circuit element.

2. A duplex optical communication module unit according to claim 1, wherein said first shell and said lead terminal are connected to each other.

3. The duplex optical communication module unit according to claim 1, wherein said first metallization layer and said lead terminal are connected to each other.

4. The duplex optical communication module unit according to claim 1, wherein said first shell, said first metallization layer and said lead terminal are connected to one another.

5. The duplex optical communication module unit according to claim 1, which further comprises a second metallization layer formed on said first major surface of said first ceramic substrate substantially over the entire area in said second space except for areas surrounding said first conductor layers for the insulation thereof.

6. The duplex optical communication module unit according to claim 1, wherein said first ceramic substrate has through-holes formed in the neighborhood of a boundary zone between said first and second spaces, said through-holes being filled with a conductive material.

7. The duplex optical communication module unit according to claim 6, wherein that said through-holes include first through-holes formed on the side of said first space along the boundary zone between said first and second spaces, the conductive material filled in said first through-holes being connected to said first metallization layer.

8. The duplex optical communication module unit according to claim 6, wherein that said through-holes include second through-holes formed on the side of said second space along the boundary zone between said first and second spaces, the conductive material filled in said second through-holes being connected to said first second metallization layer.

9. The duplex optical communication module unit according to claim 8, which further comprises at least one second ceramic substrate laminated on said second major surface of said first ceramic substrate, a circuit element formed on said first major surface of said first ceramic substrate in said second space, the circuit element for driving said light-emitting element, a plurality of third through-holes formed in said first ceramic substrate, second conductor layers being formed between said first and second ceramic substrates, and said circuit element for amplifying said output current of said light-receiving element and said circuit element for said light-emitting element being connected to said second conductor layers through said third through-holes formed in said first ceramic substrate.

10. The duplex optical communication module unit according to claim 9, which further comprises a third metallization layer surrounding said second conductor layers.

11. The duplex optical communication module unit according to claim 9, which further comprises a fourth metallization layer formed on said lamination of substrates, said first and second conductor layers being sandwiched between said fourth metallization layer and said first and second shells.

12. The duplex optical communication module unit according to claim 1, wherein said first and second shells are integral with each other.

13. The duplex optical communication module unit according to claim 1, wherein a circuit element for driving said light-emitting element is formed on said first major surface of said first ceramic substrate in said second space.

14. The duplex optical communication module unit according to claim 1, which further comprises a spacer of a ceramic member intervening between said first ceramic substrate and said first and second shells and formed with first and second openings facing said first and second spaces respectively.

15. The duplex optical communication module unit according to claim 14, wherein conductive layers are formed on the outer edge surfaces of said spacer.

16. The duplex optical communication module unit according to claim 14, wherein conductive layers are formed on the inner edge surfaces of said first and second openings formed in said spacer.

17. A duplex optical communication module unit comprising a substrate lamination including a plurality of ceramic substrates having predetermined conductor layers, a receiving module chamber and a transmitting module chamber, said module chambers being formed on said substrate lamination optically insulated from each other and hermetically sealed to said substrate lamination, a light-receiving element provided in said receiving module chamber, a light-emitting element provided in said transmitting module chamber, a first shell, having a first transparent-member facing said light receiving element, hermetically sealed to said substrate lamination and defining said receiving module chamber with said substrate lamination, and a second shell, having a second transparent member facing said light-emitting element, heremetically sealed to said substrate lamination and defining said transmitting module chamber with said substrate lamination.

18. The duplex optical module unit according to claim 17, which further comprises a receiver circuit assembled at least in said receiving module chamber.

19. A duplex optical communication module device comprising:
a duplex optical module unit including a substrate lamination of a plurality of ceramic substrates having predetermined conductive layers, a receiving module chamber and a transmitting module chamber, said module chambers being formed on said substrate lamination optically insulated from each other and hermetically sealed to said substrate lamination, a light-receiving element provided in said receiving module chamber, a light-emitting element provided in said transmitting module chamber, a first shell, having a first transparent member facing said light receiving element, heremetically sealed to said substrate lamination and defining said receiving module chamber with said substrate lamination, and a second shell, having a second transparent member facing said light-emitting element, heremetically sealed to said substrate lamination and defining said transmitting module chamber with said substrate lamination; and
an opaque receptacle for securing said duplex optical module unit and having receiving sections for receiving optical connectors inserted in opposition to said light-receiving and light-emitting elements.

* * * * *